United States Patent
Tee et al.

(10) Patent No.: US 12,120,814 B2
(45) Date of Patent: Oct. 15, 2024

(54) STRETCHABLE INTERCONNECT STRUCTURE AND METHOD OF FABRICATING THE SAME

(71) Applicant: NATIONAL UNIVERSITY OF SINGAPORE, Singapore (SG)

(72) Inventors: Chee Keong Tee, Singapore (SG); Yue Zhao, Singapore (SG); Yu Jun Tan, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 245 days.

(21) Appl. No.: 17/423,551

(22) PCT Filed: Jan. 16, 2020

(86) PCT No.: PCT/SG2020/050023
§ 371 (c)(1),
(2) Date: Jul. 16, 2021

(87) PCT Pub. No.: WO2020/149796
PCT Pub. Date: Jul. 23, 2020

(65) Prior Publication Data
US 2022/0117082 A1    Apr. 14, 2022

(30) Foreign Application Priority Data

Jan. 16, 2019   (SG) .......................... 10201900416P

(51) Int. Cl.
*H05K 1/02* (2006.01)
*H01B 1/22* (2006.01)
(Continued)

(52) U.S. Cl.
CPC ............. *H05K 1/0283* (2013.01); *H01B 1/22* (2013.01); *H05K 1/09* (2013.01); *H05K 3/4092* (2013.01); *H05K 2201/10287* (2013.01)

(58) Field of Classification Search
CPC .......... H05K 1/02; H05K 2201/10287; H05K 3/4092; H05K 1/09; H05K 1/0283; H01B 1/22
(Continued)

(56) References Cited

U.S. PATENT DOCUMENTS 6,743,982 B2   6/2004   Biegelsen et al.
9,674,949 B1   6/2017   Liu et al.
(Continued)

FOREIGN PATENT DOCUMENTS

CN          108520795 A     9/2018
KR    10-2010-0131593 A     12/2010
(Continued)

OTHER PUBLICATIONS

Oh et al., Translation of KR 10-2017-0124828 (Nov. 13, 2017) (Year: 2017).*
(Continued)

*Primary Examiner* — Tremesha S Willis
(74) *Attorney, Agent, or Firm* — Volpe Koenig

(57) ABSTRACT

A stretchable interconnect structure for electrically connecting electronic devices and a method of fabricating a stretchable interconnect structure for electrically connecting electronic devices. The method comprises the steps of providing an electrically conductive wire having a 3-dimensional helical form; and embedding the electrically conductive wire in a substrate made from an elastic material.

16 Claims, 10 Drawing Sheets

(51) Int. Cl.
*H05K 1/09* (2006.01)
*H05K 3/40* (2006.01)

(58) Field of Classification Search
USPC .......................................................... 174/254
See application file for complete search history.

(56) References Cited

U.S. PATENT DOCUMENTS

| | | | |
|---|---|---|---|
| 2013/0263351 A1* | 10/2013 | Tao | D02G 3/441 174/128.1 |
| 2014/0104793 A1 | 4/2014 | Park et al. | |
| 2015/0189753 A1 | 7/2015 | Goyal | |
| 2015/0216037 A1 | 7/2015 | Tomita | |
| 2018/0033520 A1 | 2/2018 | Yoshida et al. | |
| 2018/0068768 A1 | 3/2018 | Kim et al. | |
| 2019/0006061 A1 | 1/2019 | Son | |

FOREIGN PATENT DOCUMENTS

| | | |
|---|---|---|
| KR | 10-2017-0124828 A | 11/2017 |
| WO | 2009/111641 A1 | 9/2009 |

OTHER PUBLICATIONS

Tee, B. C. K. & Ouyang, J. Soft Electronically Functional Polymeric Composite Materials for a Flexible and Stretchable Digital Future. Adv. Mater. 0, 1802560 (2018).
Kim, D.-H. et al. Epidermal Electronics. Science (80-. ). 333, 838 LP-843 (2011).
Huang, X. et al. A differential dielectric affinity glucose sensor. Lab Chip 14, 294-301 (2014).
Kim, S. J. et al. Stretchable and Transparent Biointerface Using Cell-Sheet-Graphene Hybrid for Electrophysiology and Therapy of Skeletal Muscle. Adv. Funct. Mater. 26, 3207-3217 (2016).
Wang, Y. et al. Wearable and highly sensitive graphene strain sensors for human motion monitoring. Adv. Funct. Mater. 24, 4666-4670 (2014).
Choong, C. L. et al. Highly Stretchable Resistive Pressure Sensors Using a Conductive Elastomeric Composite on a Micropyramid Array. Adv. Mater. 26, 3451-3458 (2014).
Webb, R. C. et al. Ultrathin conformal devices for precise and continuous thermal characterization of human skin. Nat. Mater. 12, 938-944 (2013).
Son, D. et al. Multifunctional wearable devices for diagnosis and therapy of movement disorders. Nat. Nanotechnol. 9, 397-404 (2014).
Ko, H. C. et al. A hemispherical electronic eye camera based on compressible silicon optoelectronics. Nature 454, 748-753 (2008).
Song, Y. M. et al. Digital cameras with designs inspired by the arthropod eye. Nature 497, 95-99 (2013).
Rus, D. & Tolley, M. T. Design, fabrication and control of soft robots Terms of Use Design, fabrication and control of soft robots. Nature 521, 467-475 (2015).
Lu, N. & Kim, D.-H. Flexible and Stretchable Electronics Paving the Way for Soft Robotics. Soft Robot. 1, 53-62 (2014).
Tee, B. C. K. et al. A skin-inspired organic digital mechanoreceptor. Science (80-. ). 350, 313-316 (2015).
Lee, S. K. et al. Stretchable Graphene Transistors with Printed Dielectrics and Gate Electrodes. Nano Lett. 11, 4642-4646 (2011).
Yeo, W.-H. H. et al. Multifunctional Epidermal Electronics Printed Directly Onto the Skin. Adv. Mater. 25, 2773-2778 (2013).
Lim, S. et al. Transparent and stretchable interactive human machine interface based on patterned graphene heterostructures. Adv. Funct. Mater. 25, 375-383 (2015).
Xu, S. et al. Stretchable batteries with self-similar serpentine interconnects and integrated wireless recharging systems. Nat. Commun. 4, 1543-1548 (2013).

Lu, N., Lu, C., Yang, S. & Rogers, J. Highly sensitive skin-mountable strain gauges based entirely on elastomers. Adv. Funct. Mater. 22, 4044-4050 (2012).
Xu, S. et al. Assembly of micro/nanomaterials into complex, three-dimensional architectures by compressive buckling. Science (80-. ). 347, 154-159 (2015).
Matsuhisa, N. et al. Printable elastic conductors with a high conductivity for electronic textile applications. Nat. Commun. 6, 7461 (2015).
Kaltenbrunner, M. et al. An ultra-lightweight design for imperceptible plastic electronics. Nature 499, 458-463 (2013).
Park, S., Vosguerichian, M. & Bao, Z. A review of fabrication and applications of carbon nanotube film-based flexible electronics. Nanoscale 5, 1726-1727 (2013).
Zhu, Y., Xu, F., Wang, X. & au, Y. Wavy ribbons of carbon nanotubes for stretchable conductors. Adv. Funct. Mater. 22, 1279-1283 (2012).
Lee, P. et al. Highly stretchable or transparent conductor fabrication by a hierarchical multiscale hybrid nanocomposite. Adv. Funct. Mater. 5671-5678 (2014). doi:10.1002/adfm.201400972.
Xu, F. & au, Y. Highly Conductive and Stretchable Silver Nanowire Conductors. Adv. Mater. 24, 5117-5122 (2012).
Liang, J. et al. Silver Nanowire Percolation Network Soldered with Graphene Oxide at Room Temperature and Its Application for Fully Stretchable Polymer Light-Emitting Diodes. ACS Nano 8, 1590-1600 (2014).
Akter, T. & Kim, W. S. Reversibly Stretchable Transparent Conductive Coatings of Spray-Deposited Silver Nanowires. ACS Appl. Mater. Interfaces 4, 1855-1859 (2012).
Perelaer, J. et al. Printed electronics: the challenges involved in printing devices, interconnects, and contacts based on inorganic materials. J. Mater. Chem. 20, 8446 (2010).
Jang, K.-I. I. et al. Soft network composite materials with deterministic and bio-inspired designs. Nat. Commun. 6, 1-11 (2015).
Bae, H. J. et al. Biomimetic Microfingerprints for Anti-Counterfeiting Strategies. Adv. Mater. 27, 2083-2089 (2015).
Sun, Y., Choi, W. M., Jiang, K, Huang, Y. Y. & Rogers, J. A. Controlled buckling of semiconductor nanoribbons for stretchable electronics Nat. Nanotechnol 1,201-207 (2006).
Cao, O. & Chen X. Buckling of single-walled carbon nanotubes upon bending: Molecular dynamics simulations and finite element method. Phys. Rev. B—Condens. Matter Mater. Phys. 73,1-10 (2006).
Wang, B, Bao, S., Vinnikova, S., Ghanta, P. & Wang, S. Buckling analysis in stretchable electronics, npj Flex. Electron 1,5 (2017).
Lamoureux, A. et al Dynamic kirigami structures for integrated solar tracking. Nat. Commun. 6. 1-6 (2015).
Silverberg, J. L. et al. Origami structures with a critical transition to bistability arising from hidden degrees of freedom. Nat. Mater. 14,389-393 (2015).
Carlson, H. Spring manufacturing handbook. (M. Dekker, 19182).
Pineda, F., Bottausci, F.,Icard, B., Malaquin; L, & Fouillet, Y. Using electrofluidic devices as hyper-elastic strain sensors: Experimental and theorical analysis. Microelectron. Eng. 144,27-31 (2015).
Shang, Y. et at Super-Stretchable Spring-Like Carbon Neonate Ropes. Adv. Mater. 24, 2896-2900(2012).
Hyun, D. C. et at Ordered Zigzag Stripes of Polymer Gel/Metal Nanoparticle Composites for Highly Stretchable Conductoe Electrodes. Adv. Mater. 23,2946-2950 (2011).
Sekkani, T. et at A Rubberlike Stretchable Ac the Matrix Using Black Conductors Science (80-. ) 321,1483-1472 (2008).
Chen, Z. a al Three-dimensional flexible and conductive interconnected graphene networks grown by chemical vapour deposition. Nat. Matter 10 424-42S (2011).
Matsuhisa, N. et at Printable elastic conductors by in situ formation of silver nanoparticles from silver flakes. Nat. Mater 16, 834-840 (2017).
Zhang, Tihiu et al., Experimental and Theoretical Studies of Serpentine Microstructures Bonded to Prestrained Elastomers for Stretchable Electronics, Advanced Functional Materials, Nov. 26, 2013.

(56) References Cited

OTHER PUBLICATIONS

Extended Search Report issued in corresponding European Patent Application No. 20 740 989.7 on Feb. 11, 2022, consisting of 9 pp.

* cited by examiner

STRETCHABLE INTERCONNECT STRUCTURE AND METHOD OF FABRICATING THE SAME

CROSS REFERENCE TO RELATED APPLICATIONS

This application is a national stage entry of International Patent Application No. PCT/SG2019/050023 filed on Jan. 16, 2020 based on Singapore Patent application Ser. No. 10/201,900416P filed Jan. 16, 2019, which applications are incorporated by reference herein as fully set forth.

FIELD OF INVENTION

The present invention relates broadly to a stretchable interconnect structure and method of fabricating the same.

BACKGROUND

Any mention and/or discussion of prior art throughout the specification should not be considered, in any way, as an admission that this prior art is well known or forms part of common general knowledge in the field.

Since the turn of the millennium, the field of stretchable electronics has grown tremendously with the rapid adoption of digital technologies and increasing demand for ubiquitous electronics. To meet the demand, electronic devices are beginning to shift from rigid structures to stretchable formats to allow electronic devices to conform better to the human body [1], with various applications in epidermal electronic devices [2], biomedical engineering [3,4], healthcare monitoring [5-8], soft robotics [9-12], electronic skins [13-15] and human-machine interfaces [16]. The development in stretchable electronics was further propelled by the swift development of low-dimensional nanomaterials and material processing techniques during the past decades. Compared with the conventional rigid printed circuit boards, the stretchable counterparts demonstrate the ability to bend, twist, and stretch by having soft elastomeric materials as their substrates.

Electrical conductors and conductive interconnects are crucial to the development of stretchable electronic circuits. Several strategies have been investigated for creating stretchable conductors [17-21]. Composites made using nanomaterials show excellent potential as stretchable conductors because they provide both mechanical stretchability and electrical conductivity. Many research efforts have shown that nanomaterials such as carbon nanotubes (CNT) [22-24] and silver nanowires (AgNWs) [25-27] can be dispersed into or coated onto elastomeric substrate as stretchable conductors. They can also be printed onto polymer substrate as stretchable interconnects [28]. Stable integrity and conductivity performance can be achieved by introducing different structural designs such as network [29], wavy [23,30], buckled [31-33], kirigami [34] and origami [35]. However, challenges remain in developing stretchable conductors: (i) conductivity tends to decrease with increased strain; (ii) relatively low conductivities are exhibited ($\sim 10^3$ S/cm), compared with the conventional rigid metal interconnects ($\sim 10^5$ S/cm).

U.S. Pat. No. 6,743,982B2 describes a stretchable interconnect for electrically connecting electronic devices comprises a photolithographically patterned conductor extending between two of said devices for electrically coupling a contact of one device to a contact of another device. The stretchable interconnect preferably comprises a coiled conductor. The coiled conductor is formed of a metal or alloy having a stress gradient extending through a thickness of said conductor. However, the stretchability from a pure stress gradient is limited and may be applicable only to larger scale dimensioned applications. Furthermore, the process of fabrication with the stress gradient extending though the thickness of the conductor is complex.

Embodiments of the present invention seek to address at least one of the above problems.

SUMMARY

In accordance with a first aspect of the present invention, there is provided a stretchable interconnect structure for electrically connecting electronic devices, the stretchable interconnect structure comprising an electrically conductive wire having a 3-dimensional helical form, the electrically conductive wire being embedded in a substrate made from an elastic material.

In accordance with a second aspect of the present invention, there is provided a method of fabricating a stretchable interconnect structure for electrically connecting electronic devices, the method comprising the steps of:
  providing an electrically conductive wire having a 3-dimensional helical form; and
  embedding the electrically conductive wire being in a substrate made from an elastic material.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Embodiments of the present invention can provide an interfacial design to enable stretchable conductors with ultra-high conductivity and robustness to strain using three-dimensional (3D) helical micro-interconnects embedded in an elastic rubber substrate.

Stretchable conductors are critical building blocks for enabling new forms of wearable and curvilinear electronics. Embodiments of the present invention can provide an interfacial design to enable stretchable conductors with ultra-high conductivity and robustness to high strain (preferably >100%) using, in an example embodiment, three-dimensional (3D) helical copper micro-interconnects embedded in an elastic rubber substrate (eHelix-Cu). The interfacial mechanics of the metal-elastomer according to example embodiments was studied to demonstrate highly reversible conductivities with strains. The stretchable eHelix-Cu interconnect according to an example embodiment has an ultra-high conductivity (~$10^5$ S cm$^{-1}$) that remains almost invariant when stretched to 170%, which is significantly higher than other approaches using nanomaterials. The stretchable conductors according to example embodiments can withstand strains of 100% for thousands of cycles, demonstrating remarkable durability for exciting potential wearable electronic applications.

Figure 1A:
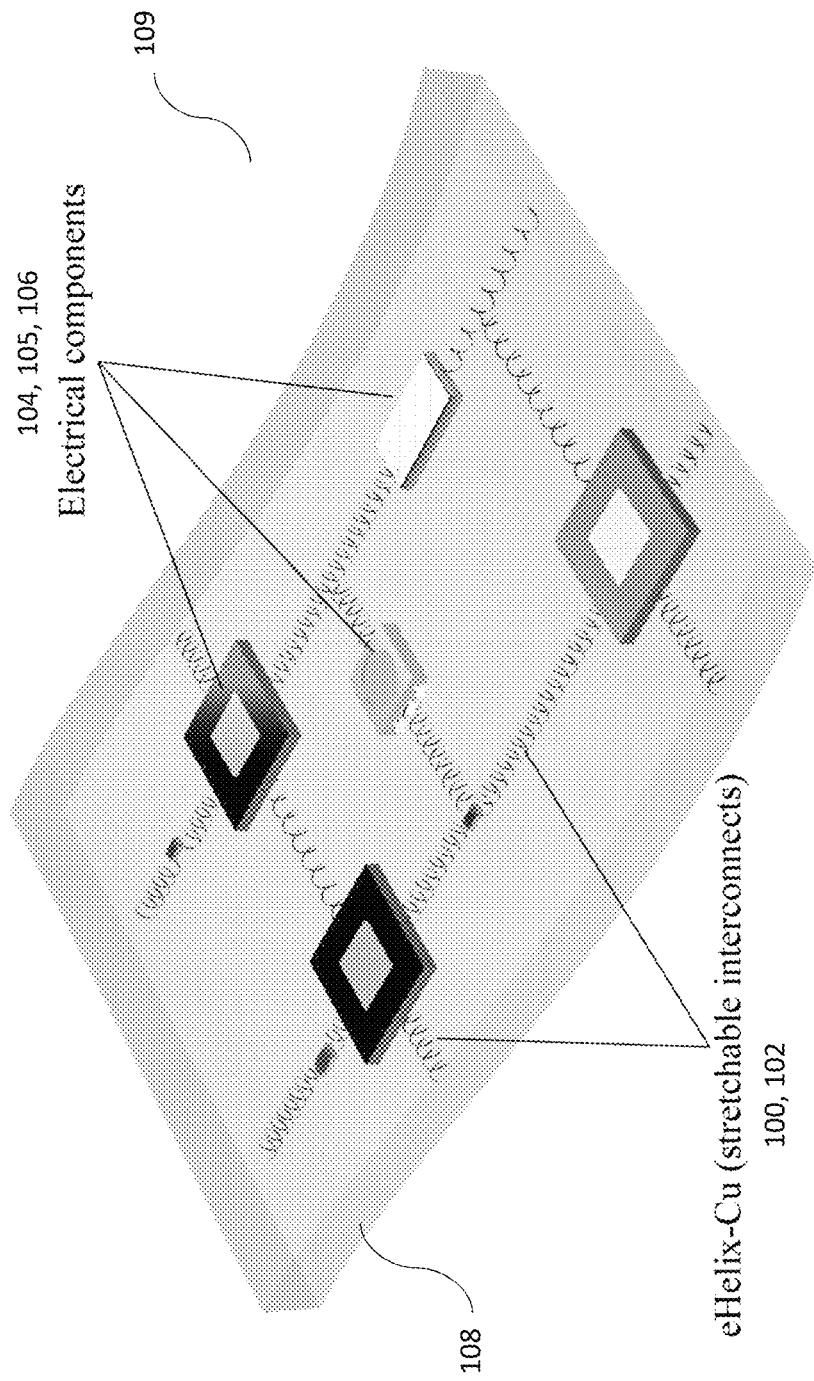
FIG. 1(a) shows a schematic diagram illustrating 3D helix-structured micro-interconnects embedded in a polymer substrate (eHelix-Cu) according to example embodiments connecting multiple electronic components.

In order to achieve high conductivity with high strain-invariance, embodiments of the present invention provide 3D micro-interconnects in helical form factors. In an example embodiment shown in FIG. 1(a), a helical-shaped metal wires e.g. 100, 102 as interconnects between electrical components e.g. 104-106 are embedded in a stretchable polymer substrate 108, constituting a device 109 according to an example embodiment. Embodiments of the present invention aim to address the two main challenges in meeting the requirements of high conductivity and stretchability in stretchable interconnects.

Fabrication Process According to Example Embodiments

Figure 1B:
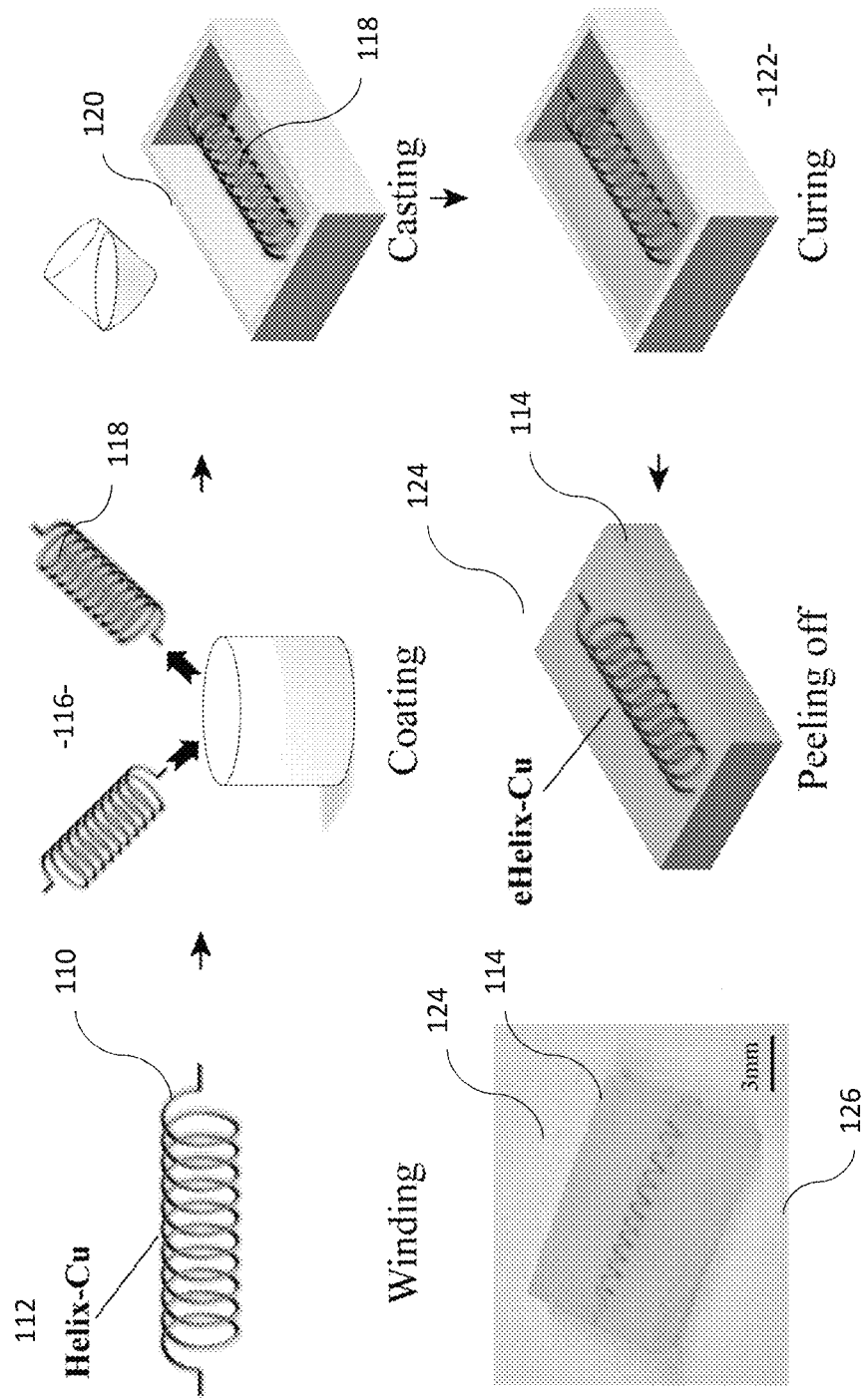
FIG. 1(b) shows schematic diagrams illustrating the fabrication process of a stretchable interconnect structure according to an example embodiment.

The fabrication process of the stretchable interconnects according to an example embodiment is shown in FIG. 1(b), using off-the-shelf enameled copper wire 110. The wire is first formed into a 3D helical form (referred to as 'Helix-Cu') 112, before it is encapsulated into silicone-based elastomers as will be described in more detail below.

The off-the-shelf enameled copper wire 110 has an ultra-high conductivity of 5.8-5.9×$10^5$ S cm$^{-1}$ according to its data sheet, which is two orders of magnitude higher than metallic nanowires such as AgNWs. The wire 110 is first formed into a 3D helical form 112, as mentioned above. The method used to form the Helix-Cu 112 according to example embodiments is facile, and akin to spring winding, i.e. a method used to wrap a wire at a certain speed around a moving rod [36]. The dimensions of the Helix-Cu 112 according to example embodiments studied herein are 10 mm in length, 0.85 (±0.01) mm in diameter, with 10 numbers of active coils and 1 mm pitch.

The Helix-Cu 112 is encapsulated into silicone-based elastomers according to example embodiments to enhance its elasticity, i.e., ability to return to its original shape. Without the silicone elastomer, the Helix-Cu 112 is unable to stretch elastically. Due to the significant differences in moduli between the Helix-Cu 112 and the elastomer, interfaces between the Helix-Cu 112 and the silicone substrate 114 tend to slip and delaminate while stretching. In order to strengthen their bonding strength, the Helix-Cu 112 is preferable surface treated, in one embodiment dip-coated as indicated as numeral 116, before encapsulating it in the silicone-based elastomer. It is noted, however, that the ability to return to its original shape and to substantially maintain its conductivity is not limited to having the surface treated, e.g. by way of an adhesive. That is, the 3D helical wire can be directly encapsulated in the elastomer in different example embodiments.

In one embodiment a silicone adhesive (Sil-Poxy™), a single component adhesive explicitly made for bonding between silicones and between silicone to another substrates including polymers, ceramics, fabrics, etc., is used for the surface treatment. Because the enameled copper wire 110 used in the example embodiment has a polyurethane insulation layer, the silicone adhesive advantageously provides relatively flexible and robust bonding between the enameled copper wire 110 and the silicone substrate 114. To preferably ensure a uniform coating onto the copper wire's 112 surface, dichloromethane (DCM) was used to dilute the silicone adhesive before coating. The Helix-Cu 112 was dipped into a 5 wt % of silicone adhesive (5 grams of the silicone adhesive in a total volume of 100 mL solution) for 2 seconds. After few seconds when the DCM evaporated after the dipping, the silicone adhesive was coated onto the surface of the Helix-Cu, yielding an adhesive coated Helix-Cu 118 uniformly. The coated Helix-Cu 118 was then placed into a mold 120 (12 mm in length, 8 mm in width, and 3 mm in thickness) that was pre-treated on its surface with silane (Sigmacote®) for an effortless removal of the polymer substrate 114 from the mold 120 later on. Uncured silicone (Ecoflex™ mixed in 1A:1B by weight) was poured into the mold and subsequently cured, indicated at numeral 122 for 4 hours at room temperature or put in an oven at a temperature of about 70° C. degrees for about 15 minutes, and subsequently removed from the mold 120, yielding an interconnect 124. An image 126 of the fabricated elastic helical copper interconnect 124, referred to as 'eHelix-Cu', after removing from the mold 120 is also shown in FIG. 1(b).

Figure 1C:
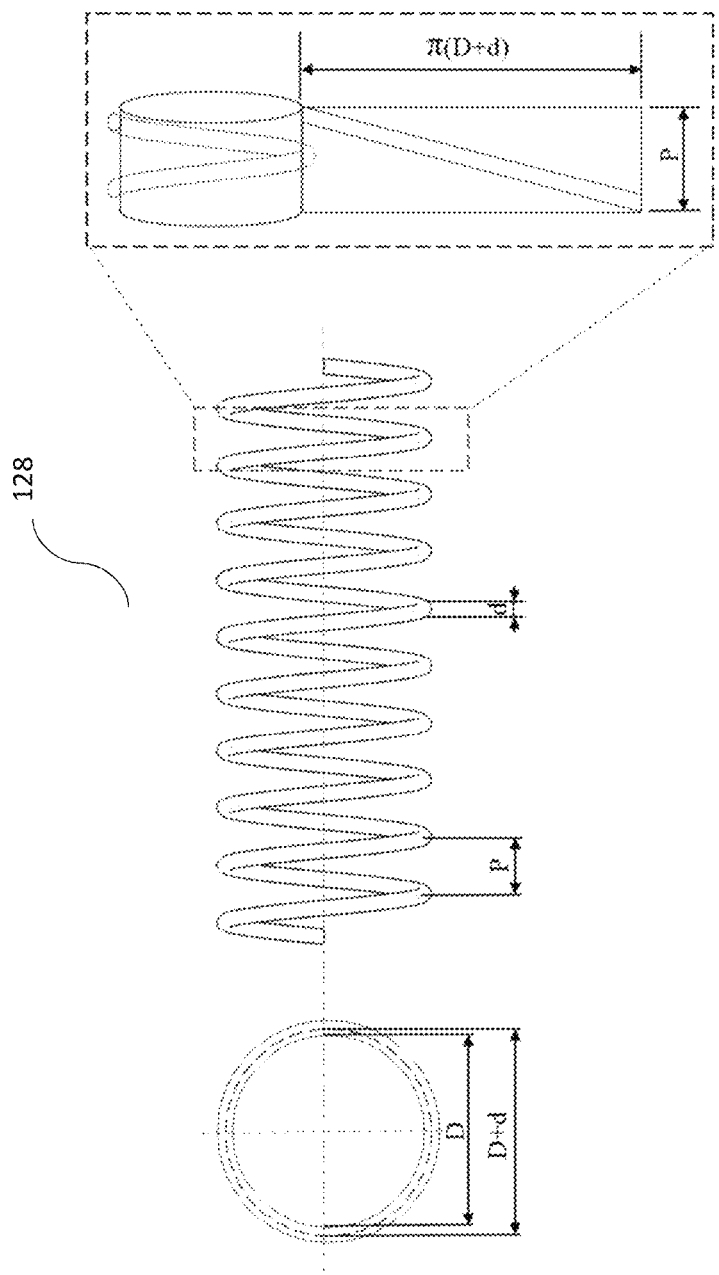
FIG. 1(c) shows a schematic diagram illustrating parameters for theoretical analysis of a 3D helix-structured micro-interconnect embedded in a polymer substrate (eHelix-Cu) according to an example embodiment.

With reference to FIG. 1(c), the structure of helix shape 128 for the wire in accordance with example embodiments can be designed by changing the geometric parameters based on the following equation (1):

$$n = \frac{\sqrt{\pi^2(d+D)^2 + P^2}}{P}, \quad (1)$$

where n denotes geometric ratio, d denotes a wire cross-section diameter, D denotes helix structure diameter, and P denotes helix structure pitch.

Simulation Study for Example Embodiments

Figure 2:
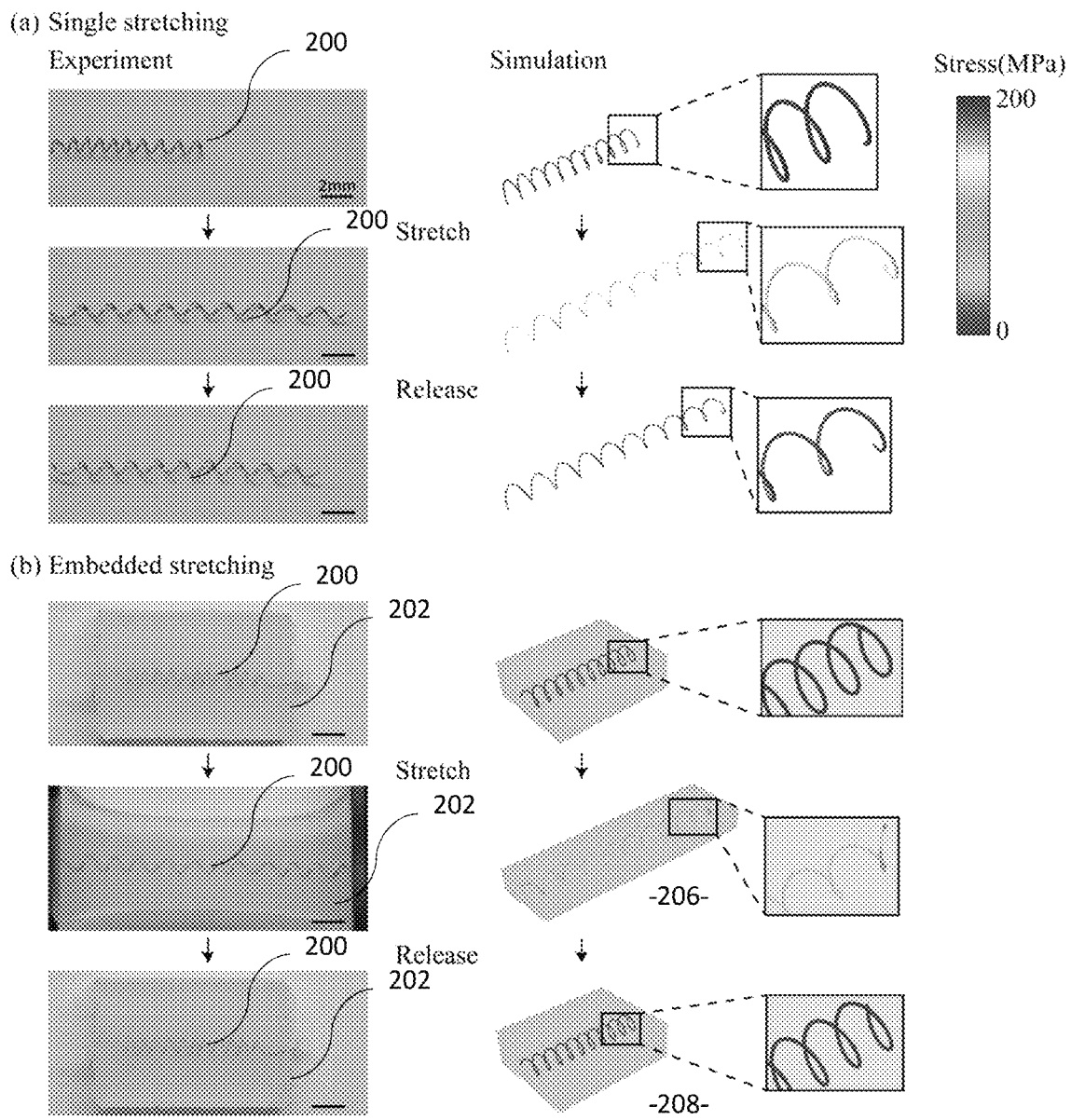
FIG. 2(a) shows photographs (left) and simulation results (right) of Helix-Cu being stretched to 100% strain and partially returned.
FIG. 2(b) shows photographs (left) and simulation results (right) showing the eHelix-Cu (embedded using Ecoflex 00-50) according to an example embodiment being stretched to 100% strain and completely return to its original dimensions.

A simulation study for example embodiments is illustrated in FIGS. 2(a) and (b). It was found that when the enameled copper wire 200 without substrate is stretched beyond 15%, it is not able to return to its original shape, as shown in FIG. 2(a). Once the strain is beyond 15%, every element of the enameled copper wire 200 enters its plastic deformation range and cannot completely recover its original shape. On the other hand, embedding the winded enameled copper wire 200 into a stretchable polymer substrate 202 according to example embodiments, the whole composite can be stretched to 100% strain and then recover to its original shape after being released, by the support of the encapsulating polymer substrate as shown in FIG. 2(b). The experimental result is in good agreement with the simulation results shown on the right side of FIGS. 2(a) and (b), where the enameled copper wire 200 embedded in the substrate 202 (together referred to as eHelix-Cu) can sustain much larger strains than the wire itself. The whole composite can be stretched and return entirely within 100% strain range.

In more detail, Sample images of the enameled copper wire 200 by itself (also referred to as Helix-Cu) are shown in FIG. 2(a). Based on its geometrical specifications, if the enameled copper wire 200 is fully stretched until perfectly straight, the length of the straight wire is 2.7 times longer than the unstretched wire. In other words, the maximum geometrical strain of the Helix-Cu 200 is 170%. However, Helix-Cu cannot be stretched to 170% strain and then return entirely by itself. Simulation (Abaqus2016/CAE) of the stretching performance of the Helix-Cu 200 is also shown in FIG. 2(a). A finite element analysis (FEA) model was made using the geometrical specifications mentioned above. The material properties used in this study were: density 8.9 g/cm³, Young's modulus 117 GPa, Poisson's ratio 0.34 and ultimate tensile strength (UTS) 148 MPa according to the datasheet. It was found that when the Helix-Cu 200 is stretched beyond 15%, it is not able to return to its original shape. Once the strain is beyond 15%, every element of the Helix-Cu enters its plastic deformation range and cannot completely recover its original shape.

To enhance the stretchability of the Helix-Cu, eHelix-Cu according to an example embodiments was fabricated by embedding the winded enameled copper wire 200 into a stretchable polymer substrate 202 shown in FIG. 2(b). A model of the eHelix-Cu was built up in simulation and is also shown in FIG. 2(b). The Mooney-Rivlin model was used, one of the available hyperelastic models, to describe the material behavior of silicone Ecoflex. Two parameters in the Mooney-Rivlin model: $C_{01}$=10410.8 Pa, $C_{10}$=21362 Pa were used as in [37]. FIG. 2(b) shows that the model of eHelix-Cu can be stretched to 100% strain as indicated at numeral 206 and then recover to its original shape after being released, by the support of the encapsulating polymer substrate 202, as indicated at numeral 208. The experimental result as illustrated in the sample images shown in FIG. 2(b) is in good agreement with the simulation results, where the eHelix-Cu can sustain much larger strains than Helix-Cu 200 by itself.

Mechanical Result and Analysis for Example Embodiments

Figure 3:
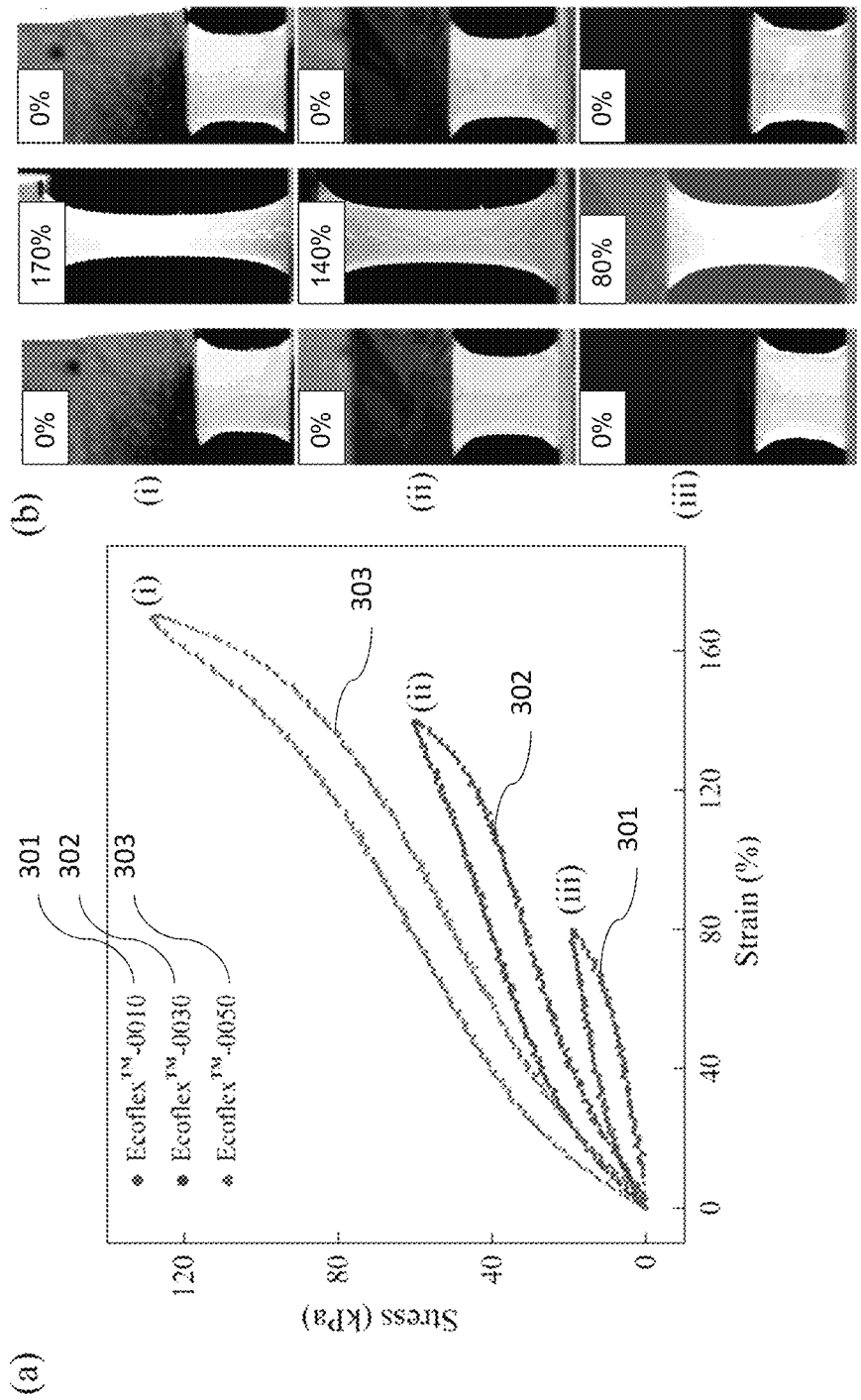
FIG. 3(a) shows a graph illustrating a comparison of stress versus strain of eHelix-Cu interconnects embedded in Ecoflex 00-50 (i), Ecoflex 00-30 (ii), and Ecoflex 00-10 (iii), according to respective example embodiments.
FIG. 3(b) shows photographs of (i) deformation of eHelix-Cu interconnects embedded in Ecoflex 00-50 according to an example embodiment after returning from strain 170%; (ii) deformation of eHelix-Cu interconnects embedded in Ecoflex 00-30 according to an example embodiment after returning from strain 140%; (iii) deformation of eHelix-Cu interconnects embedded in Ecoflex 00-10 according to an example embodiment after returning from strain 80%.
FIG. 3(c) shows a graph illustrating a comparison of stress versus strain of single Ecoflex series and eHelix-Cu interconnects embedded in Ecoflex series, according to example embodiments.
Figure 3:
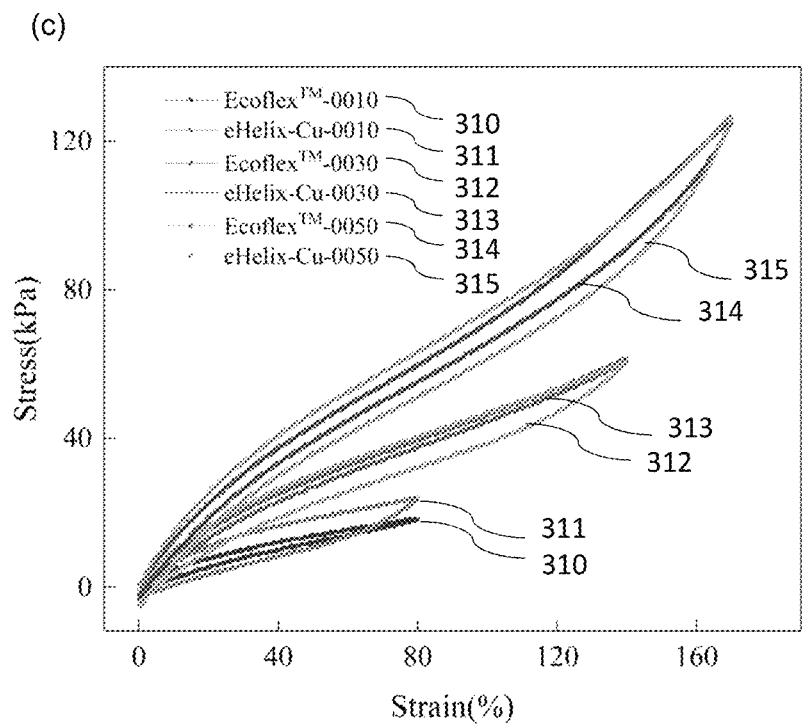

It was found that when embedded in different elastomer substrates, eHelix-Cu according to example embodiments could extend and then return with different values of maximum strain without causing plastic deformation, as shown in FIGS. 3(a) and (b). As shown in FIG. 3(b)(iii), when using the softest Ecoflex 00-10, eHelix-Cu could be stretched to within 80% strain and completely recovered without structural deformation. Beyond 80% strain, out-of-plane deformation occurred in the middle part of helix interconnects, and the whole interconnects remained wrinkled. For Ecoflex 00-30, which is slightly stiffer than Ecoflex 00-10, the maximum strain limit of the eHelix-Cu without structural deformation reached up to 140% strain as shown in FIG. 3(b)(ii). On the other hand, when embedded in the stiffest material among Ecoflex series—Ecoflex 00-50, there was no structural deformation in eHelix-Cu even after being stretched and released from its maximum geometrical strain limit (170%, as discussed above) as can be seen from FIG. 3(b)(i). Therefore, different substrate materials with various Young's moduli affect the stretching performance of the eHelix-Cu. FIG. 3(a) shows the stress-strain curves (301-303) of the respective Ecoflex series materials according to example embodiment for their respective maximum strain during stretching and releasing without plastic deformation. At the same strain ratio, Ecoflex 00-50 (curve 303) experienced larger stress than the other materials, which also means that it can provide more force to pull the eHelix-Cu interconnects back to their original position after stretching. Since the interfacial bonding between the Helix-Cu's surface and polymer substrate is strong enough to prevent delamination, Ecoflex 00-50 as a polymer substrate can advantageously support the eHelix-Cu according to an example embodiment to function as stretchable interconnects within its maximum geometrical strain limit of 170%.

In more detail, to study the mechanical performance of the eHelix-Cu according to example embodiments embedded in different polymer substrate materials, we chose Ecoflex 00-10, Ecoflex 00-30, and Ecoflex 00-50. These materials vary in their tensile strength and elongation, as shown in Table I. The eHelix-Cu samples according to example embodiments with different embedding substrate materials were fabricated with the same method described above with reference to FIG. 1(b). For the uniaxial tensile tests, the sample was clamped and then stretched by using a linear translation stage (Newmark Systems) at 5% strain rate and 0.5 mm/s speed. The maximum geometrical strain limit for the enameled copper wire (i.e. Helix-Cu) used was calculated to be around 170%, as described above. Hence, the tensile performance was analyzed within 170% strain due to the geometrical limitations.

TABLE I

| Substrate material | Tensile Strength (MPA) | Max Strain w/ deforming (%) | Break at Elongation (%) |
| --- | --- | --- | --- |
| None | — | 15% (by simulation) | — |
| EcoFlex ™ 00-10 | 0.83 | 80% | 300% |
| Ecoflex ™ 00-30 | 1.38 | 140% | 400% |
| Ecoflex ™ 00-50 | 2.2 | >170% | 500% |

With referenced to Table I, with an increasing tensile strength of the substrate material, eHelix-Cu according to example embodiments can reach larger strain limit without permanent deformation that might deteriorate its function and durability. Moreover, stress versus strain of each of the Ecoflex™ series materials and eHelix-Cu interconnects embedded in the respective Ecoflex™ series materials was also compared, as shown in FIG. 3(c). It was found that stretching performances are very similar, compare curves 310 and 311 (Ecoflex™ 00-10 with and without Helix-C, respectively, curves 312 and 313 (Ecoflex™ 00-30 with and without Helix-Cu, respectively, and curves 314 and 315 (Ecoflex™ 00-50 with and without Helix-Cu, respectively. For releasing, the stress versus strain curve of eHelix-Cu decreases more than Ecoflex™ itself, compare again curves 310 and 311 (Ecoflex™ 00-10 with and without Helix-Cu, respectively, curves 312 and 313 (Ecoflex™ 00-30 with and without Helix-C, respectively, and curves 314 and 315 (Ecoflex™ 00-50 with and without Helix-Cu, respectively. This is believed to be because of more energy loss caused by possible Helix-Cu plastic deformations and friction with Ecoflex™ during releasing.

Electrical Result and Analysis for Example Embodiments

Figure 4A:
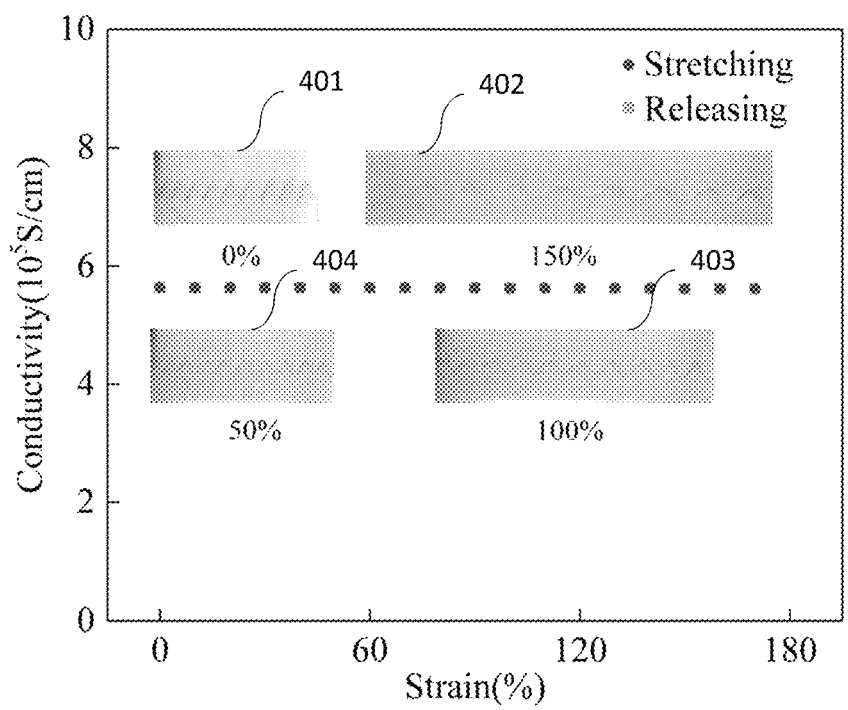
FIG. 4(a) shows a graph and photographs illustrating conductivity versus strain for one cycle of stretching and return of an eHelix-Cu interconnect according to an example embodiment.

The electrical conductivities with the change in strains of eHelix-Cu samples embedded in Ecoflex 00-50 substrate according to example embodiments was also characterized. As can be seen in FIG. 4(a), within one round of stretching and releasing of the sample, it was found that the conductivity of eHelix-Cu did not change as it was stretched to 170% strain and then returned to its original length. The images 401-404 of the sample at different strain positions (0%, 50%, 100%, 150%, respectively) are also shown in FIG. 4(a). It is noted that in the graph, conductivity of the wire remains almost the same while stretching. The stretching and releasing curves thus appear coincident in FIG. 4(a).

Figure 4B:
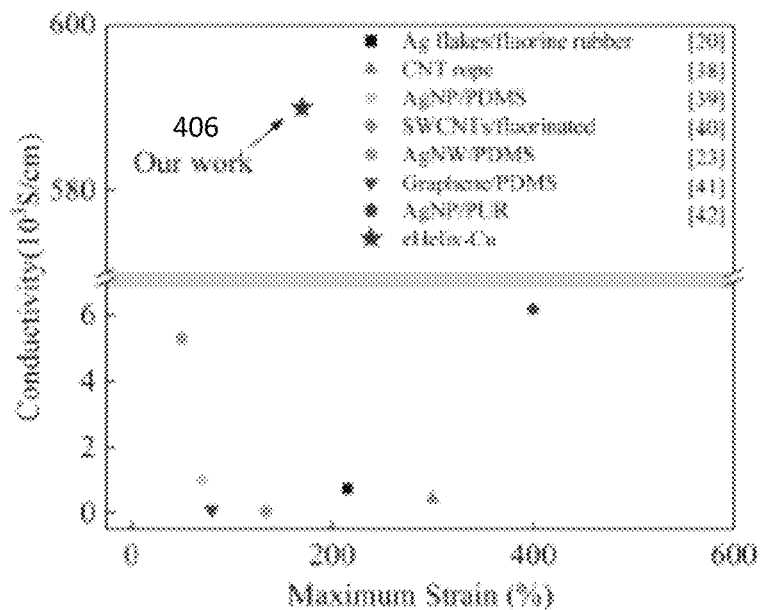
FIG. 4(b) shows a graph illustrating a comparison of conductivity and maximum strain of eHelix-Cu according to an example embodiment vs reported stretchable conductors.

The conductivities vs strains of eHelix-Cu according to an example embodiment were also compared with other stretchable conductors reported in the literature [20,38,39,40,23,41,42] in FIG. 4(b). The eHelix-Cu according to an example embodiment (point 406) shows significant advantage in terms of electrical conductivity. For example, by using various conductive nano-fillers into polymer substrate, conductivities (~$10^3$ S/cm, compare the other points shown in the graph in FIG. 4(b)) are hundred times lower than achieved compared to that the metal wire (~$10^5$ S/cm) used in example embodiments, whereas the eHelix-Cu according to an example embodiment (point 406) achieved about $5.9\times10^5$ S/cm. In addition, the eHelix-Cu according to an example embodiment (point 406) was able to reach 170% maximum strain ratio, which is highly competitive in comparison to prior works, compare the other points shown in the graph in FIG. 4(b). It is noted again that the maximum strain ratio for example embodiments can further be improved by changing the geometric parameters of eHelix-Cu structures based on equation (1) above.

Figure 5:
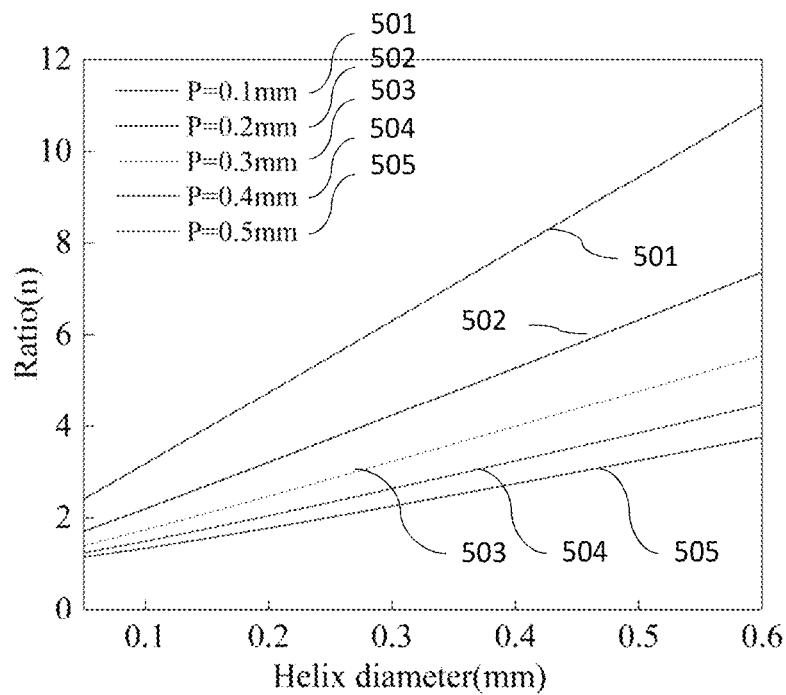
FIG. 5 shows a graph showing that the maximum geometrical strain ratios of helical structure can be changed by varying the diameter and pitch of the Helix-Cu for use in example embodiments.

By calculation, it is possible to design the maximum geometrical ratio of the helical structure used in example embodiments by changing the diameter and pitch of the helical structure. Theoretically, the maximum strain of the helix structure can reach more than 1000%, as shown in FIG. 5, curves 501-505, which is far beyond the maximum strain ratio of the substrate material in this embodiment, Ecoflex 00-50, itself (500%). It is noted that the same elastomeric substrate can be used in such embodiments if one increases its geometrical maximum strain ratio by structure design. The resistance will increase if one increases the geometrical maximum strain ratio (because the total length of the wire increases), as will be appreciated by a person skilled in the art. Alternatively or additionally, different substrate materials may be used in different embodiments.

Cyclic Result and Analysis for Example Embodiments

Figure 4C:
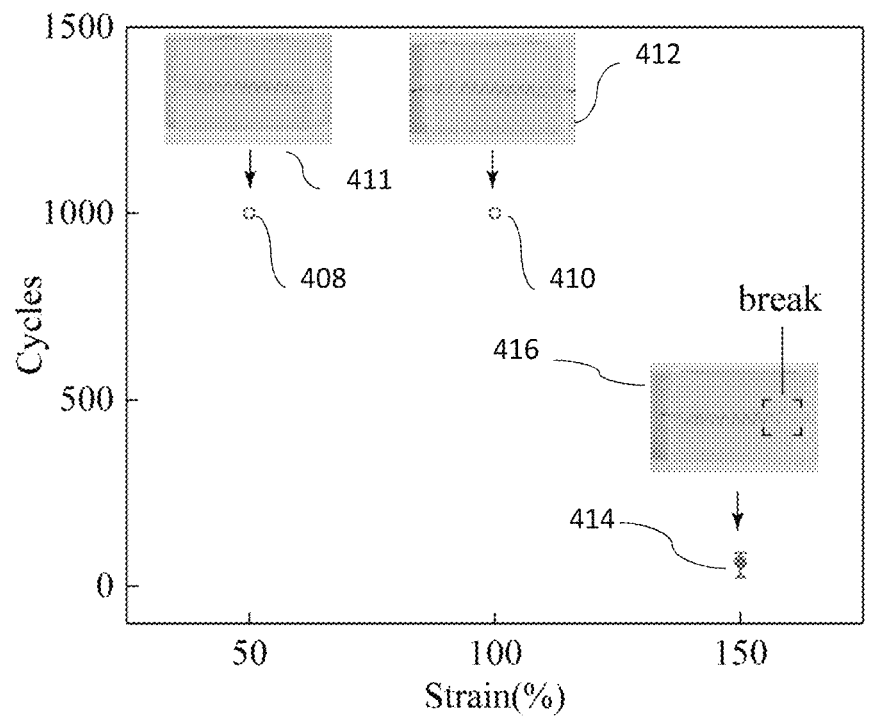
FIG. 4(c) shows a graph and photographs illustrating the durability of the eHelix-Cu (embedded in Ecoflex 00-50) according to an example embodiment in cyclic tests with different strain limits, namely 50%, 100%, and 150%.

To analyze the durability of the eHelix-Cu according to an example embodiment (embedded in Ecoflex 00-50), cyclic tests with different strain limits, such as 50%, 100%, and 150% were performed and the results are shown in FIG. 4(c). For 50% and 100% strain limit (points 408 and 410, respectively), the samples can be stretched to 1000 cycles without damage. Images 411 and 412 in FIG. 4(c) show that the samples remain intact after 1000 cycles of stretching. For 150% strain (point 414, image 416), the micro-interconnects broke within 100 cycles of stretching and releasing. Thus, within 100% strain, the eHelix-Cu interconnects according to an example embodiment have outstanding durability over 1000 cycles. It is noted again that various structural designs of eHelix-Cu according to different embodiments may be incorporated by tuning parameters of the helical structure such as length, pitch, and diameter to further improve the strain performance.

Figure 6:
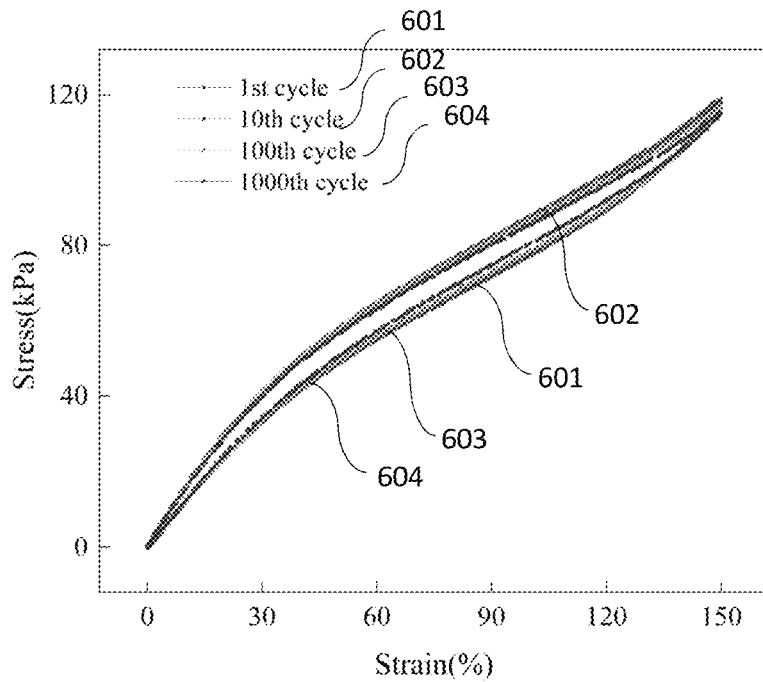
FIG. 6 shows a graph illustrating the mechanical performance (hysteresis curve) of eHelix-Cu interconnect embedded in Ecoflex 00-50 according to an example embodiment, with 100% stretching strain at 1st, 10th, 100th and 1000th cycle.

Stress versus strain curves 601-604 of eHelix-Cu interconnects embedded in Ecoflex™ 00-50 according to an example embodiment with 100% stretching strain at 1st, 10th, 100th and 1000th cycle, respectively, were measured and are shown in FIG. 6. As can be seen from the curves 601-604, the mechanical performance of eHelix-Cu according to an example embodiment is very stable within 1000 cycles of stretching.

Application Demonstration According to Example Embodiments

Figure 4D:
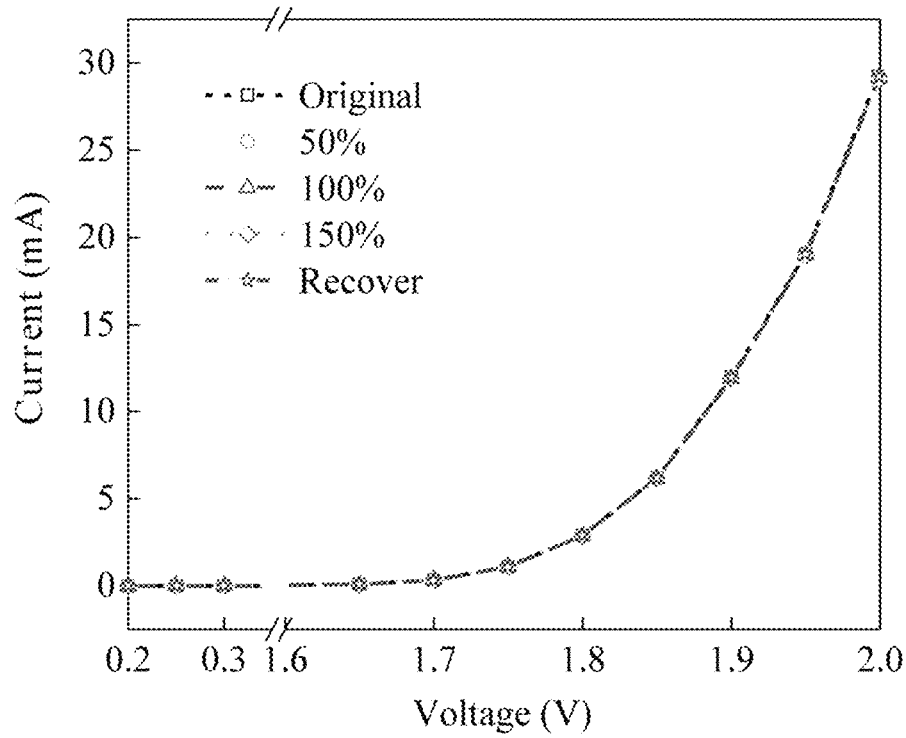
FIG. 4(d) shows the I-V characteristic curves under different strains in a stretch cycle (to 150% strain) for a light emitting device (LED) according to an example embodiment.
Figure 4E:
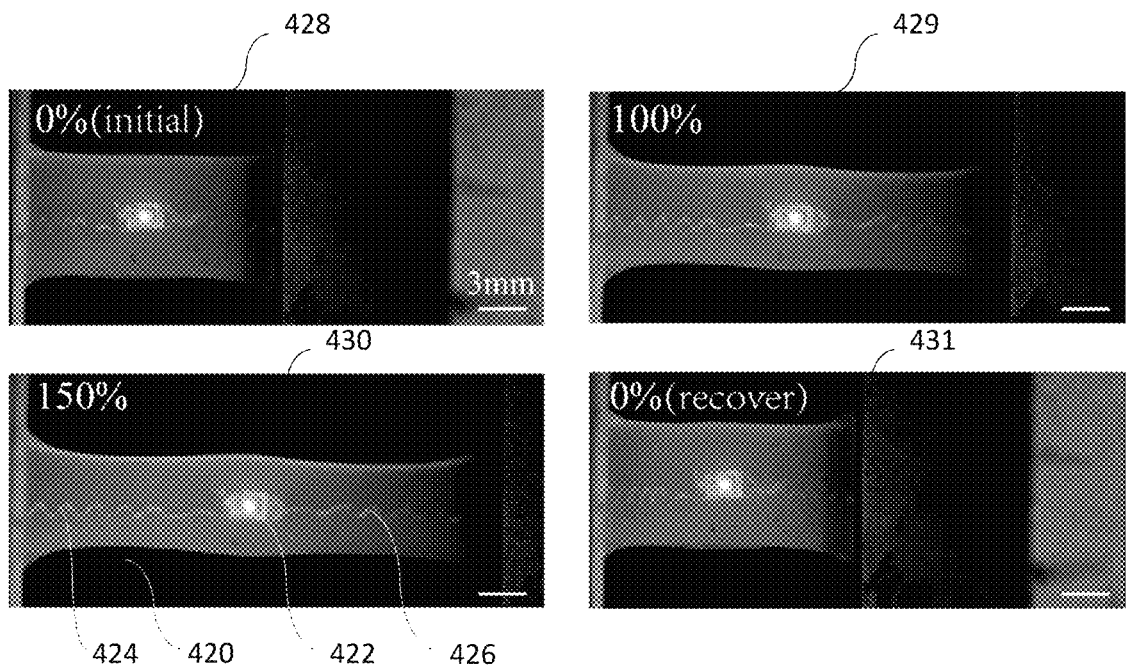
FIG. 4(e) shows pictures of the sample used for the measurements in FIG. 4(e) being stretched at different strains of 0%, 50%, 100% and 150%.

With reference to FIG. 4(e), a sample device 420 of an LED 422 connected to eHelix-Cu interconnects 424, 426 (all embedded in Ecoflex™ 00-50 according to this example embodiment) was fabricated to illustrate an example of how to use the eHelix-Cu according to example embodiments as interconnects for stretchable electronics. The I-V characteristic curves under different strains were identical in a cycle of stretch (to 150% strain), as shown in FIG. 4(d). Returning to FIG. 4(e), images 428-431 of the sample device 420 being stretched are shown at the different strains of 0%, 50%, 100% and 150%, respectively. Notably, the intensity of LED 422 did not change because the conductivity of eHelix-Cu interconnects 424, 426 according to the example embodiment remained constant with varying strains. This demonstrates that the eHelix-Cu interconnects according to example embodiments have outstanding electrical stability under different strains.

As described above, embodiments of the present invention can provide a method and structure to enable highly conductive and reversibly stretchable 3D helix metal-interconnects embedded in an elastic substrate for stretchable electronics applications.

Remarkably, the electrical conductivity remains invariant with stretching up to 170% according to example embodiments described herein. The eHelix-Cu interconnects according to example embodiments described herein can also withstand 100% strains over more than 1000 cycles of stretch. The electrical conductivities of the eHelix-Cu interconnects according to example embodiments described herein were ~2 orders of magnitude higher than for existing proposals.

With the outstanding conductivity and stretching ability, the eHelix-Cu according to example embodiments described herein has great potential to be utilized for stretchable electronics, especially as conductive interconnections between devices in stretchable electronics applications.

In one embodiment, a stretchable interconnect structure for electrically connecting electronic devices is provided, the stretchable interconnect structure comprising an electrically conductive wire having a 3-dimensional helical form, the electrically conductive wire being embedded in a substrate made from an elastic material.

A maximum geometrical strain limit substantially without non-elastic deformation of the stretchable interconnect may be greater than a maximum geometrical strain limit without non-elastic deformation of the electrically conductive wire having the 3-dimensional helical form without being embedded in the elastic material.

The maximum geometrical strain limit without non-elastic deformation of the stretchable interconnect structure may be about 80%.

The maximum geometrical strain limit without non-elastic deformation of the stretchable interconnect structure may be about 140%.

The maximum geometrical strain limit without non-elastic deformation of the stretchable interconnect structure may be about 170%.

The stretchable interconnect structure may further comprise an adhesive coating on the electrically conductive wire forming an interface between the surface of the electrically conductive wire and the elastic material.

The electrically conductive wire may be enameled.

The electrically conductive wire may comprise a polymeric insulation layer.

The stretchable interconnect structure may further comprise at least a first electronic device connected at one end of the stretchable interconnect structure.

The first electronic device may be embedded in the substrate.

The stretchable interconnect structure may exhibit a conductivity of the order of $10^5$ S/cm.

The conductivity may be substantially constant across an elastic stretchability range of the stretchable interconnect structure.

Figure 7:
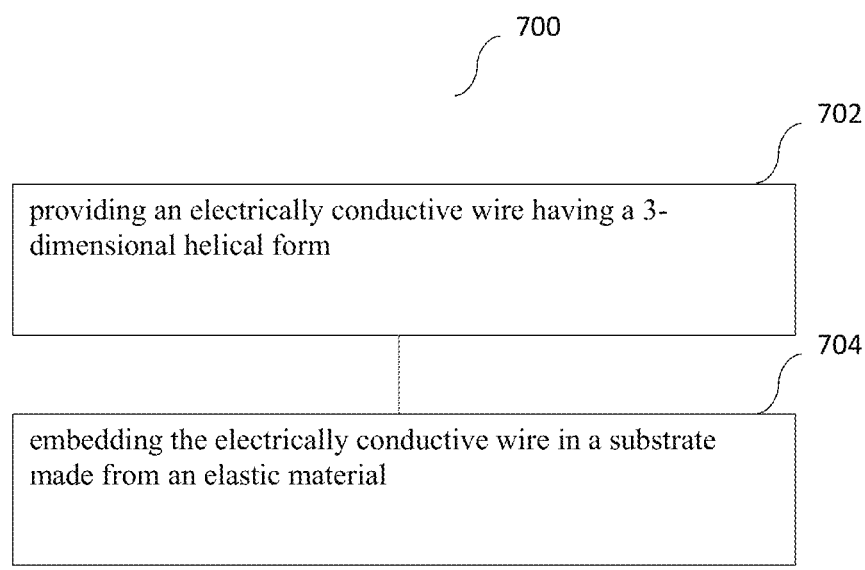
FIG. 7 shows a flow-chart illustrating a method of fabricating a stretchable interconnect structure for electrically connecting electronic devices according to an example embodiment.

FIG. 7 shows a flow-chart 700 illustrating a method of fabricating a stretchable interconnect structure for electrically connecting electronic devices according to an example embodiment. At step 702, an electrically conductive wire having a 3-dimensional helical form is provided. At step 704, the electrically conductive wire is embedded in a substrate made from an elastic material.

The method may further comprise providing an adhesive coating on the electrically conductive wire prior to embedding into the substrate for forming an interface between the surface of the electrically conductive wire and the elastic material.

The electrically conductive wire may be enameled.

The electrically conductive wire may comprise a polymeric insulation layer.

The method may further comprise connecting at least a first electronic device at one end of the embedded electrically conductive wire.

The method may comprise embedding the first electronic device in the substrate.

Embodiments of the present invention can have one or more of the following features and associated benefit/advantage:

Feature: 3D Metal-Rubber Composite Structure Design

Associated benefit/advantage: Innovative structural design for embedded stretchable electronics applications 3D helical shaped interconnects allowed its highly stable and stretchable ability Feature: Surface Bonding Treatment Associated benefit/advantage: Surface treatment to increase composite's interfacial bonding strength enhancing its life cycle Comparison of stretching performance between material with and without surface treatment are demonstrated Feature: Robust Mechanical and Electrical Performance Associated benefit/advantage: Outstanding mechanical performance of stretching and hysteresis with mechanics elaborated Highly conductive and robust electrical performance is illustrated: no conductivity changes within one stretching cycle; conductivity is ~2 orders of magnitude higher than existing proposals.

Embodiments of the present invention are ideally suited for stretchable electronics applications. Devices such as, for example, surface-mounted devices (SMD), can be integrated with interconnects according to embodiments of the present invention to realize highly stretchable electronic devices according to example embodiments. According to example embodiments, various electrical components needed/used in a complete electronic system can be steadily connected for providing, for example, wearable devices, electronic skin and other applications, which are highly demanded.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

For example, while specific example materials have been described in the example embodiments, the present invention is not limited to those materials.

The conductive wire may be made from other conductive materials such as, but not limited to, Gold, Silver, etc., and generally any conductive material with a Young's modulus similar to or below that of Copper.

The substrate may be made from other elastic materials such as, but not limited to, Polydimethylsiloxane (PDMS), Dragon skin 20, etc., and generally any material with a Young's modulus similar to or higher than Ecoflex 0050.

The adhesive layer forming the interface between the surface of the conductive wire and the elastic material according to some example embodiments may be made from other adhesive materials, or no adhesive may be used in other embodiments.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

1. Tee, B. C. K. & Ouyang, J. Soft Electronically Functional Polymeric Composite Materials for a Flexible and Stretchable Digital Future. Adv. Mater. 0, 1802560 (2018).
2. Kim, D.-H. et al. Epidermal Electronics. Science (80-.). 333, 838 LP-843 (2011).
3. Huang, X. et al. A differential dielectric affinity glucose sensor. Lab Chip 14, 294-301 (2014).
4. Kim, S. J. et al. Stretchable and Transparent Biointerface Using Cell-Sheet-Graphene Hybrid for Electrophysiology and Therapy of Skeletal Muscle. Adv. Funct. Mater. 26, 3207-3217 (2016).
5. Wang, Y. et al. Wearable and highly sensitive graphene strain sensors for human motion monitoring. Adv. Funct. Mater. 24, 4666-4670 (2014).
6. Choong, C. L. et al. Highly Stretchable Resistive Pressure Sensors Using a Conductive Elastomeric Composite on a Micropyramid Array. Adv. Mater. 26, 3451-3458 (2014).
7. Webb, R. C. et al. Ultrathin conformal devices for precise and continuous thermal characterization of human skin. Nat. Mater. 12, 938-944 (2013).
8. Son, D. et al. Multifunctional wearable devices for diagnosis and therapy of movement disorders. Nat. Nanotechnol. 9, 397-404 (2014).
9. Ko, H. C. et al. A hemispherical electronic eye camera based on compressible silicon optoelectronics. Nature 454, 748-753 (2008).
10. Song, Y. M. et al. Digital cameras with designs inspired by the arthropod eye. Nature 497, 95-99 (2013).
11. Rus, D. & Tolley, M. T. Design, fabrication and control of soft robots Terms of Use Design, fabrication and control of soft robots. Nature 521, 467-475 (2015).
12. Lu, N. & Kim, D.-H. Flexible and Stretchable Electronics Paving the Way for Soft Robotics. Soft Robot. 1, 53-62 (2014).
13. Tee, B. C. K. et al. A skin-inspired organic digital mechanoreceptor. Science (80-.). 350, 313-316 (2015).
14. Lee, S. K. et al. Stretchable Graphene Transistors with Printed Dielectrics and Gate Electrodes. Nano Lett. 11, 4642-4646 (2011).
15. Yeo, W.-H. H. et al. Multifunctional Epidermal Electronics Printed Directly Onto the Skin. Adv. Mater. 25, 2773-2778 (2013).
16. Lim, S. et al. Transparent and stretchable interactive human machine interface based on patterned graphene heterostructures. Adv. Funct. Mater. 25, 375-383 (2015).
17. Xu, S. et al. Stretchable batteries with self-similar serpentine interconnects and integrated wireless recharging systems. Nat. Commun. 4, 1543-1548 (2013).
18. Lu, N., Lu, C., Yang, S. & Rogers, J. Highly sensitive skin-mountable strain gauges based entirely on elastomers. Adv. Funct. Mater. 22, 4044-4050 (2012).
19. Xu, S. et al. Assembly of micro/nanomaterials into complex, three-dimensional architectures by compressive buckling. Science (80-.). 347, 154-159 (2015).
20. Matsuhisa, N. et al. Printable elastic conductors with a high conductivity for electronic textile applications. Nat. Commun. 6,7461 (2015).
21. Kaltenbrunner, M. et al. An ultra-lightweight design for imperceptible plastic electronics. Nature 499, 458-463 (2013).
22. Park, S., Vosguerichian, M. & Bao, Z. A review of fabrication and applications of carbon nanotube film-based flexible electronics. Nanoscale 5, 1726-1727 (2013).
23. Zhu, Y., Xu, F., Wang, X. & Zhu, Y. Wavy ribbons of carbon nanotubes for stretchable conductors. Adv. Funct. Mater. 22, 1279-1283 (2012).
24. Lee, P. et al. Highly stretchable or transparent conductor fabrication by a hierarchical multiscale hybrid nanocomposite. Adv. Funct. Mater. 5671-5678 (2014). doi: 10.1002/adfm.201400972
25. Xu, F. & Zhu, Y. Highly Conductive and Stretchable Silver Nanowire Conductors. Adv. Mater. 24, 5117-5122 (2012).
26. Liang, J. et al. Silver Nanowire Percolation Network Soldered with Graphene Oxide at Room Temperature and Its Application for Fully Stretchable Polymer Light-Emitting Diodes. ACS Nano 8, 1590-1600 (2014).
27. Akter, T. & Kim, W. S. Reversibly Stretchable Transparent Conductive Coatings of Spray-Deposited Silver Nanowires. ACS Appl. Mater. Interfaces 4, 1855-1859 (2012).
28. Perelaer, J. et al. Printed electronics: the challenges involved in printing devices, interconnects, and contacts based on inorganic materials. J. Mater. Chem. 20, 8446 (2010).
29. Jang, K.-I. I. et al. Soft network composite materials with deterministic and bio-inspired designs. Nat. Commun. 6, 1-11 (2015).
30. Bae, H. J. et al. Biomimetic Microfingerprints for Anti-Counterfeiting Strategies. Adv. Mater. 27, 2083-2089 (2015).

31. Sun, Y., Choi, W. M., Jiang, H., Huang, Y. Y. & Rogers, J. A. Controlled buckling of semiconductor nanoribbons for stretchable electronics. Nat. Nanotechnol. 1, 201-207 (2006).
32. Cao, G. & Chen, X. Buckling of single-walled carbon nanotubes upon bending: Molecular dynamics simulations and finite element method. Phys. Rev. B—Condens. Matter Mater. Phys. 73, 1-10 (2006).
33. Wang, B., Bao, S., Vinnikova, S., Ghanta, P. & Wang, S. Buckling analysis in stretchable electronics. npj Flex. Electron. 1, 5 (2017).
34. Lamoureux, A. et al. Dynamic kirigami structures for integrated solar tracking. Nat. Commun. 6, 1-6 (2015).
35. Silverberg, J. L. et al. Origami structures with a critical transition to bistability arising from hidden degrees of freedom. Nat. Mater. 14, 389-393 (2015).
36. Carlson, H. Spring manufacturing handbook. (M. Dekker, 1982).
37. Pineda, F., Bottausci, F., Icard, B., Malaquin, L. & Fouillet, Y. Using electrofluidic devices as hyper-elastic strain sensors: Experimental and theoretical analysis. Microelectron. Eng. 144, 27-31 (2015).
38. Shang, Y. et al. Super-Stretchable Spring-Like Carbon Nanotube Ropes. Adv. Mater. 24, 2896-2900 (2012).
39. Hyun, D. C. et al. Ordered Zigzag Stripes of Polymer Gel/Metal Nanoparticle Composites for Highly Stretchable Conductive Electrodes. Adv. Mater. 23, 2946-2950 (2011).
40. Sekitani, T. et al. A Rubberlike Stretchable Active Matrix Using Elastic Conductors. Science (80-.). 321, 1468-1472 (2008).
41. Chen, Z. et al. Three-dimensional flexible and conductive interconnected graphene networks grown by chemical vapour deposition. Nat. Mater. 10, 424-428 (2011).
42. Matsuhisa, N. et al. Printable elastic conductors by in situ formation of silver nanoparticles from silver flakes. Nat. Mater. 16, 834-840 (2017).

The invention claimed is:

1. A stretchable interconnect structure for electrically connecting electronic devices, the stretchable interconnect structure comprising: an electrically conductive wire having a 3-dimensional helical form, the electrically conductive wire being embedded in a substrate made from an elastic material; and an adhesive coating on the electrically conductive wire providing a bond between the surface of the electrically conductive wire and the elastic material.

2. The stretchable interconnect structure of claim 1, wherein a maximum geometrical strain limit substantially without non-elastic deformation of the stretchable interconnect is greater than a maximum geometrical strain limit without non-elastic deformation of the electrically conductive wire having the 3-dimensional helical form without being embedded in the elastic material.

3. The stretchable interconnect structure of claim 2, wherein the maximum geometrical strain limit without non-elastic deformation of the stretchable interconnect structure is about 80%.

4. The stretchable interconnect structure of claim 2, wherein the maximum geometrical strain limit without non-elastic deformation of the stretchable interconnect structure is about 140%.

5. The stretchable interconnect structure of claim 2, wherein the maximum geometrical strain limit without non-elastic deformation of the stretchable interconnect structure is about 170%.

6. The stretchable interconnect structure of claim 1, wherein the electrically conductive wire is enameled.

7. The stretchable interconnect structure of claim 6, wherein the electrically conductive wire comprises a polymeric insulation layer.

8. The stretchable interconnect structure of claim 1, further comprising at least a first electronic device connected at one end of the stretchable interconnect structure.

9. The stretchable interconnect structure of claim 8, wherein the first electronic device is embedded in the substrate.

10. The stretchable interconnect structure of claim 1, exhibiting a conductivity of the order of $10^5$ S/cm.

11. The stretchable interconnect structure of claim 10, wherein the conductivity is substantially constant across an elastic stretchability range of the stretchable interconnect structure.

12. A method of fabricating a stretchable interconnect structure for electrically connecting electronic devices, the method comprising the steps of:
   providing an electrically conductive wire having a 3-dimensional helical form; and
   embedding the electrically conductive wire in a substrate made from an elastic material;
   wherein an adhesive coating is provided on the electrically conductive wire prior to embedding into the substrate and the method further comprises forming a bond between the surface of the electrically conductive wire and the elastic material by the adhesive coating.

13. The method of claim 12, wherein the electrically conductive wire is enameled.

14. The method of claim 13, wherein the electrically conductive wire comprises a polymeric insulation layer.

15. The method of claim 12, further comprising connecting at least a first electronic device at one end of the embedded electrically conductive wire.

16. The method of claim 15, comprising embedding the first electronic device in the substrate.

* * * * *